(12) United States Patent
Chaba et al.

(10) Patent No.: US 7,710,183 B2
(45) Date of Patent: May 4, 2010

(54) CMOS LEVEL SHIFTER CIRCUIT DESIGN

(75) Inventors: Ritu Chaba, San Diego, CA (US);
Dongkyu Park, San Diego, CA (US);
ChangHo Jung, San Diego, CA (US);
Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/204,147

(22) Filed: Sep. 4, 2008

(65) Prior Publication Data

US 2010/0052763 A1    Mar. 4, 2010

(51) Int. Cl.
*G06G 5/00* (2006.01)

(52) U.S. Cl. .............................. 327/333; 326/81; 326/63

(58) Field of Classification Search ............. 326/62–63, 326/80–81; 327/306, 333
See application file for complete search history.

(56) References Cited

U.S. PATENT DOCUMENTS

| 7,239,191 | B2 * | 7/2007 | Lee ............................. 327/333 |
| 7,348,801 | B2 * | 3/2008 | Nojiri ......................... 326/81 |
| 7,511,552 | B2 * | 3/2009 | Ali et al. ..................... 327/333 |

* cited by examiner

*Primary Examiner*—Dinh T. Le
(74) *Attorney, Agent, or Firm*—Nicholas J. Pauley; Sam Talpalatsky; Peter Kamarchik

(57) ABSTRACT

A level shifting circuit has a pair of assist circuits. The level shifting circuit includes an input point, an output point, a pair of cross-coupled PMOS transistors coupled to the output point, and a pair of NMOS transistors coupled between the input and output points. Each assist circuit includes a pair of PMOS transistors, one responsive to an input applied to the input point, the other responsive to the drain voltage of one of the NMOS transistors. The assist circuits temporarily weaken the cross-coupled PMOS transistors when an input changes from low to high, or from high to low. The assist circuits also transiently boost the output.

5 Claims, 3 Drawing Sheets

CMOS LEVEL SHIFTER CIRCUIT DESIGN

BACKGROUND

1. Field of Disclosure

This disclosure relates generally to level shifting circuits, and in particular to level shifting circuits with increased voltage ranges and reduced insertion delays.

2. Background

In various electronic devices, integrated circuits operating at low supply voltages are interfaced with electronic circuits operating at higher supply voltages. For example, a chip set operating at a first core voltage level (VddL), for example at 0.7 V, can interface with a memory device operating at a higher voltage level (VddH), for example at 1.4 V. In such cases, a level shifting circuit ("level shifter") can be employed to maintain communication between circuits of different supply voltage levels.

Conventional level shifting circuits operate satisfactorily at low voltage ranges, but can fail at low VddL values and wider voltage ranges. In addition, the insertion delay of a level shifting circuit may become unacceptably large. Thus, the development of level shifters operating over relatively wider voltage ranges with reduced insertion delays is desirable.

SUMMARY

In one aspect, a level shifting circuit includes assist circuits. In one configuration, the level shifting circuit includes an input point, an output point, and a cross-coupled pair of field effect transistors of a first type coupled to the output point. The level shifting circuit also includes a pair of assist circuits that are responsive to changes in input and output voltage levels, and that transiently change the gate-to-source and source-to-drain voltages of the pair of field effect transistors of the first type. The level shifting circuit also includes a pair of field effect transistors of a second type coupled between the input and output points. The field effect transistor pair of the second type are responsive to input voltage levels. In certain configurations, the field effect transistors of the first type are PMOS devices, and the field effect transistors of the second type are NMOS devices.

In another aspect, a method of shifting a voltage level is provided. The method includes providing an input signal to a circuit, and, in response to the input signal, transiently weakening one member of a pair of cross-coupled field effect transistors of the circuit until an output node coupled to the pair of cross-coupled field effect transistors is pulled to a final voltage.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific configurations disclosed may be readily utilized as a basis for modifying or designing other structures for carrying out the same purposes of the present disclosure. It should also be realized by those skilled in the art that such equivalent constructions do not depart from the spirit and scope of the invention as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
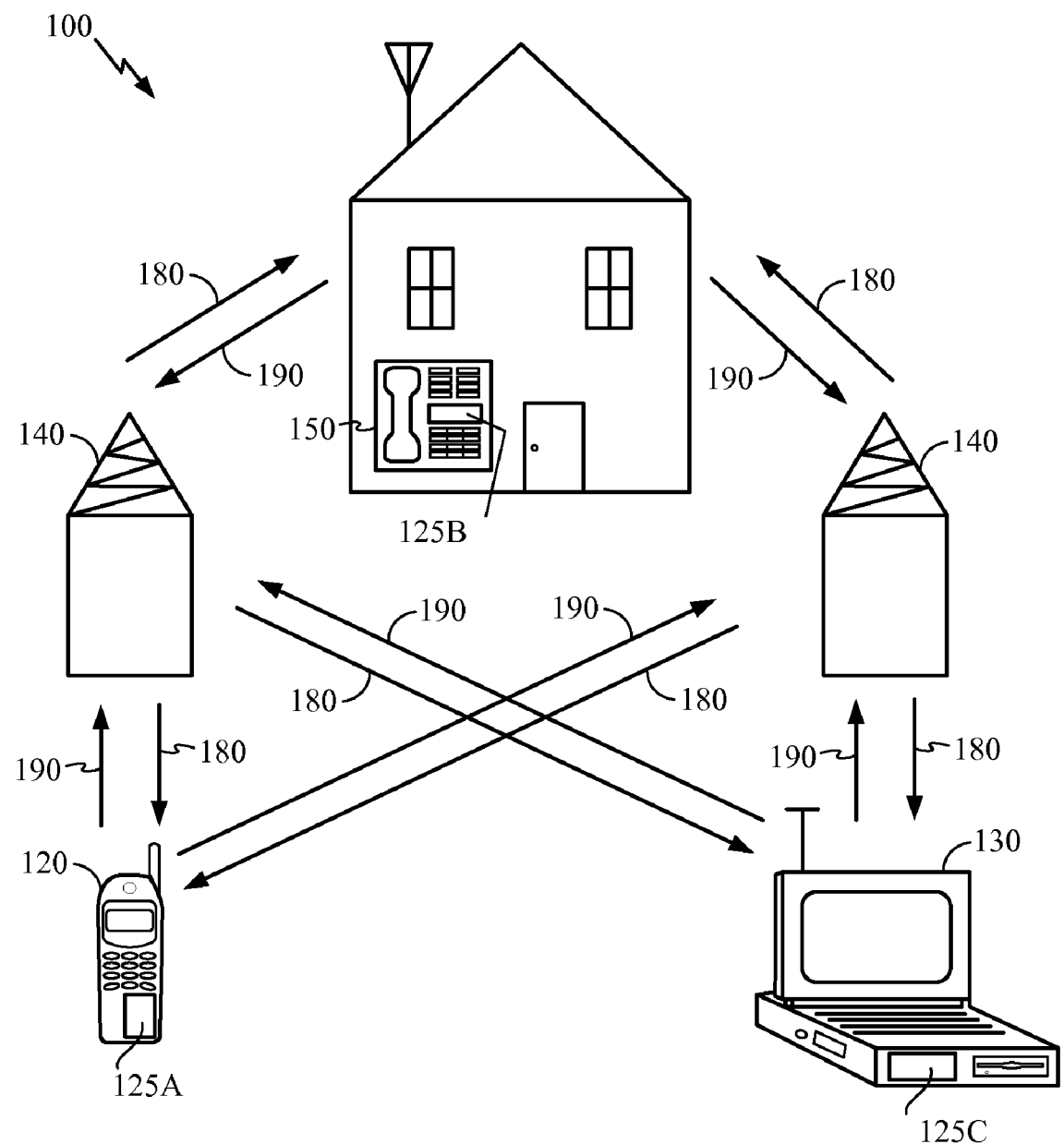
FIG. 1 shows an exemplary wireless communication system in which embodiments of the invention may be advantageously employed.

FIG. 1 shows an exemplary wireless communication system 100 in which an embodiment of the invention may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include level shifting circuits 125A, 125B and 125C, which is an embodiment of the invention as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the invention, the invention is not limited to these exemplary illustrated units. The invention may be suitably employed in any device which includes level shifting circuits.

Figure 2:
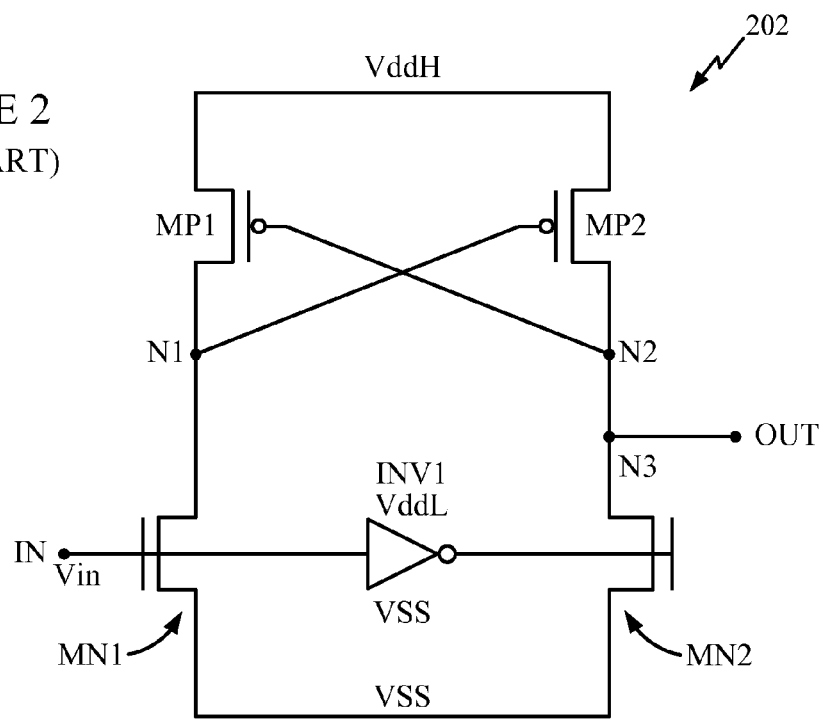
FIG. 2 is a circuit diagram of a conventional level shifting circuit.

A conventional level shifting circuit 202 is shown in FIG. 2. The circuit 202 includes two NMOS transistors MN1, MN2 with their sources coupled to ground voltage VSS, and two PMOS transistors MP1, MP2 with their sources coupled to a source voltage VddH. The drain of the NMOS transistor MN1 is coupled to the drain of the PMOS transistor MP1, and the drain of the NMOS transistor MN2 is coupled to the drain of the PMOS transistor MP2. The gate of the PMOS transistor MP1 is coupled at a node N2 to the drains of the NMOS and PMOS transistors MN2, MP2, while the gate of the PMOS transistor MP2 is coupled at a node N1 to the drains of the NMOS and PMOS transistors MN1, MP1. As a result, the gate of the PMOS transistor MP1 is coupled to the drain of the PMOS transistor MP2, and the gate of the PMOS transistor MP2 is coupled to the drain of the PMOS transistor MP1, forming a cross-coupled pair of PMOS transistors. A node N3 is coupled to an output point OUT.

In the conventional level shifting circuit 202 shown in FIG. 2, an input point IN is coupled to the gate of the NMOS transistor MN1. The input point IN is also coupled to an inverter INV, which in turn is coupled to the gate of the NMOS transistor MN2.

When an input signal Vin is in a low level (VSS), the NMOS transistor MN1 is turned off. At the same time, a signal at the level of VddL is applied via the inverter circuit INV to the gate of the NMOS transistor MN2, turning this transistor on so that the node N2 and the output node N3 are at the voltage level of VSS. Due to the cross-coupling from the node N2 to the gate of the PMOS transistor MP1, the PMOS transistor MP1 is turned on so that the node N1 has a voltage level of VddH. Thus, when the input signal Vin is in a low level, the output point OUT is at a voltage level of VSS and the node N1 is at a voltage level of VddH.

When the input signal Vin is in a high level (VddL), the NMOS transistor MN1 is turned on. As a result, the node N1 has a voltage level of VSS. At the same time, a low input signal is applied via the inverter circuit INV to the gate of the NMOS transistor MN2, turning this transistor off. Due to the cross coupling from the node N1 to the gate of the PMOS transistor MP2, this transistor is turned on, and the output node N3 is at the voltage level of VddH. Consequently, when the input signal Vin is in a high level, the output point OUT is at voltage level of VddH and the node N1 is at a voltage level of VSS.

When the input signal Vin changes from low to high, the NMOS transistor MN1 turns on and attempts to pull the node N1 from the voltage level of VddH to the voltage level of VSS. However, the PMOS transistor MP1 is still on and resists (or "fights") the drop in voltage at the node N1. A similar conflict between the PMOS and NMOS transistors MP2,MN2 occurs when the input signal Vin changes from high to low: the NMOS transistor MN2 turns on and attempts to pull the output node N2 from the high voltage level of VddH to the low value of VSS. Although the conventional level shifting circuit can operate satisfactorily when the voltage range between VddH and VddL is relatively small, as VddL becomes lower and the voltage range increases, the PMOS devices become stronger than the NMOS devices, and the NMOS devices are unable to pull down their nodes. Under these conditions, the conventional level shifting circuit 202 will fail. To minimize such failures, the NMOS devices can be made stronger, although this increases the area of the devices.

Figure 3:
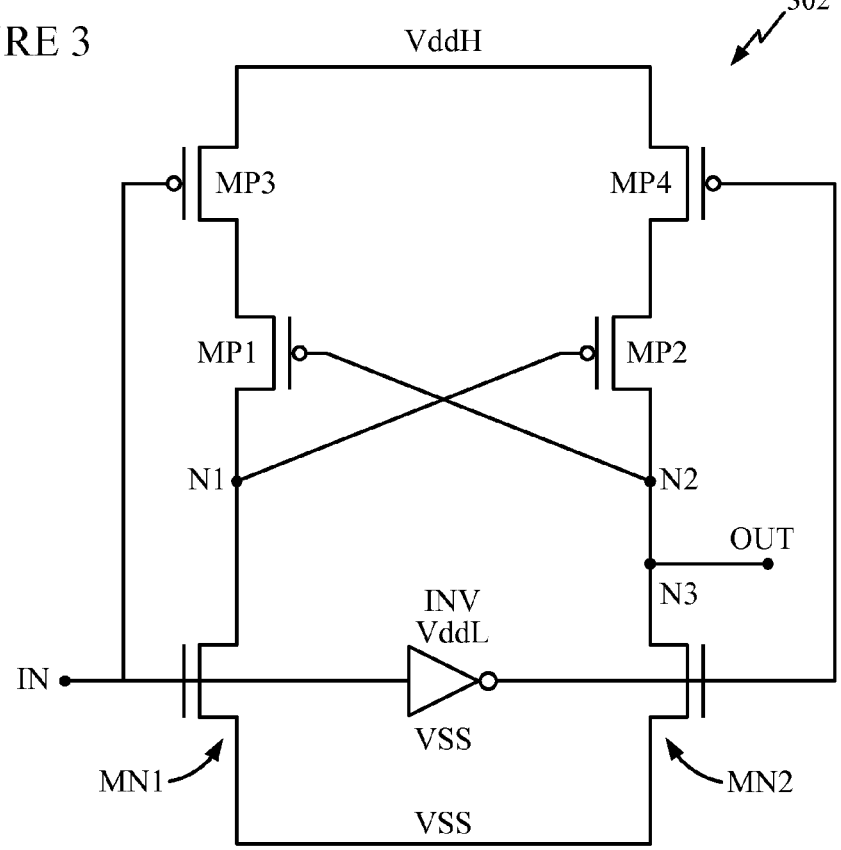
FIG. 3 is a circuit diagram of a second conventional level shifting circuit based on PMOS transistors in series.

One way of modifying the level shifting circuit 202 to handle wider voltage ranges is to add circuit components in series with the existing PMOS devices. A circuit of this type is shown in FIG. 3. In this level shifting circuit 302, NMOS transistors MN1,MN2 and PMOS transistors MP1,MP2 are arranged as in the conventional level shifting circuit 202 shown in FIG. 2. However, in the level shifting circuit 302, a third PMOS transistor MP3 is added in series with the PMOS transistor MP1, and a fourth PMOS transistor MP4 is added in series with the PMOS transistor MP2. The gate of the PMOS transistor MP3 is coupled to an input point IN. The input point IN is also coupled to an inverter circuit INV, which is coupled to the gate of the NMOS transistor MN2 and the added PMOS transistor MP4. The drains of the NMOS and PMOS transistors MN1,MP1 are coupled at a node N1, and the drains of the NMOS and PMOS transistors MN2,MP2 are coupled at a node N2. An output node N3 is coupled to an output point OUT.

When an input signal Vin in a low level is applied, the NMOS transistor MN1 is turned off while the PMOS transistor MP3 is turned on. At the same time, a high input signal is applied via the inverter circuit INV to the gate of the NMOS transistor MN2, turning this transistor on, and to the gate of the PMOS transistor MP4, turning this transistor partially off. As a result, the nodes N2,N3 are at a voltage value of VSS. Due to the cross-coupling from the node N2 to the gate of the PMOS transistor MP1, this transistor is on. Thus, both PMOS transistors MP1,MP3 are on, and the node N1 is at a voltage value of VddH. Therefore, when the input signal is in a low level, the output point OUT is at a voltage level of VSS and the node N1 is at a voltage level of VddH.

As the input signal changes from a low to a high level (from VSS to VddL), the NMOS transistor MN1 turns on and begins to pull down the node N1 from a voltage level of VddH to VSS. This drop in voltage at the node N1 is opposed by the PMOS transistor MP1, which is still on. As the input signal changes from low to high, however, the gate of the PMOS transistor MP3 also goes higher to a voltage value of VddL. This means that the gate voltage of the PMOS transistor MP3 is now closer to the transistor's source value of VddH. Because the gate-to-source voltage of the PMOS transistor MP3 is less, the transistor is partially turned off. In essence, applying VddL to the gate of the PMOS transistor MP3 "weakens" the transistor and allows the NMOS transistor MN1 to more easily pull down the node N1. Similarly, when the output node N3 goes from VddH to VSS, a voltage value of VddL is applied to the gate of the PMOS transistor MP4, turning this transistor partially off and making it easier for the NMOS transistor MN2 to pull the output node N3 to a lower value.

Although the level shifting circuit 302 can work successfully at lower VddL values and at wider voltage ranges than the conventional circuit 202, the time interval required for an input to produce an output (or the "insertion delay") is large since two PMOS devices are used for each NMOS device.

Figure 4:
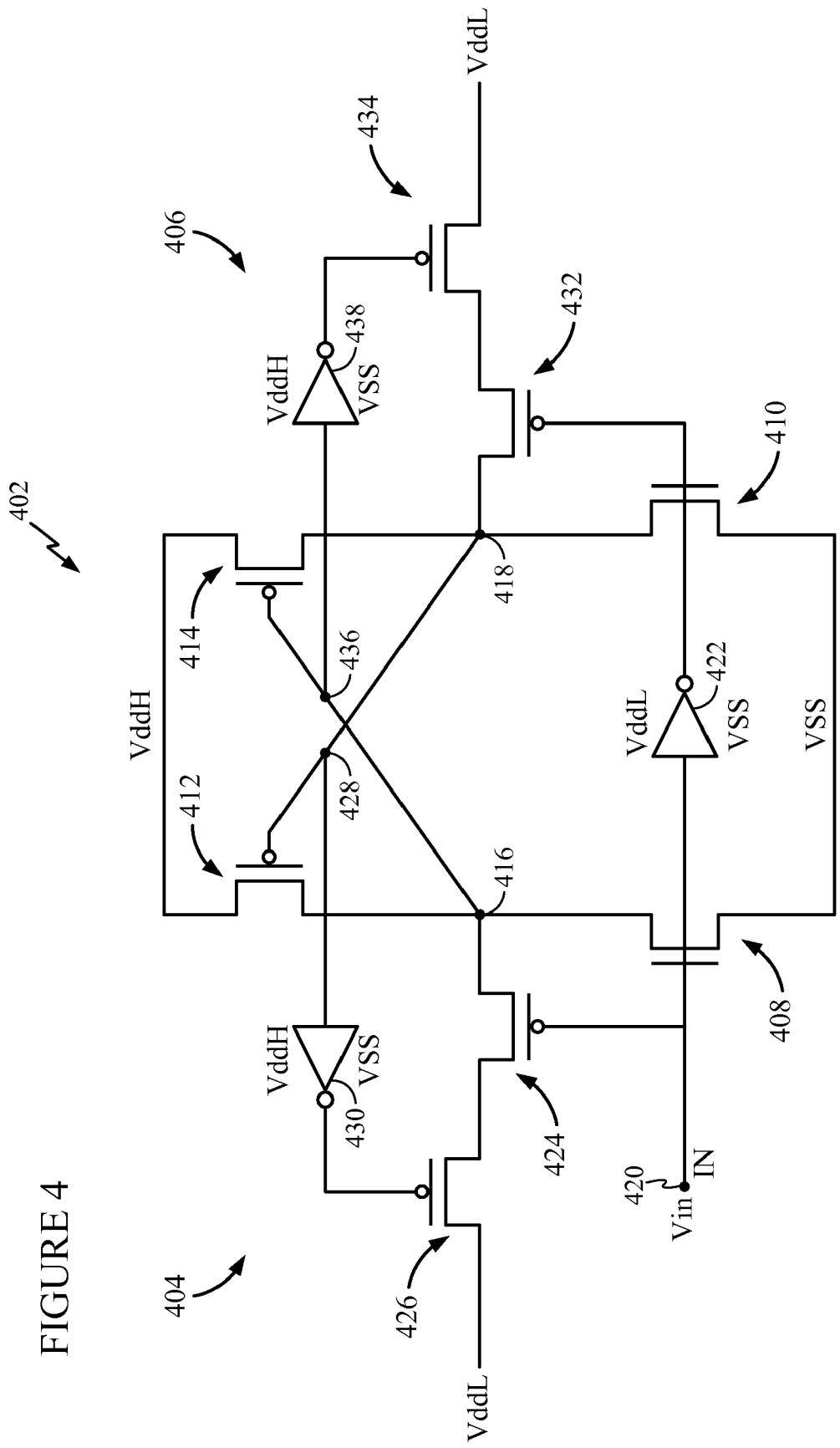
FIG. 4 is a circuit diagram of a level shifting circuit that includes assist circuits.

A configuration of a level shifting circuit having a pair of assist circuits is shown in FIG. 4. In the configuration, a level shifting circuit 402 includes a pair of assist circuits 404,406, each of which comprises two field effect transistors of a first type, in this case two PMOS transistors (or devices), coupled to an output node. One portion of the level shifting circuit 402 comprises two field effect transistors of a second type, in this case two NMOS transistors (or devices) 408,410, with their sources coupled to ground voltage VSS, and two field effect transistors of the first type, in this case two PMOS transistors (or devices) 412,414, with their sources coupled to a source voltage VddH. The drain of the NMOS transistor 408 is coupled to the drain of the PMOS transistor 412, and the drain of the NMOS transistor 410 is coupled to the drain of the PMOS transistor 414. At a node 416, the gate of the PMOS transistor 414 is coupled to the drains of the NMOS and PMOS transistors 408,412, while the gate of the PMOS transistor 412 is coupled at an output node 418 to the drains of the NMOS and PMOS transistors 410,414. As a result, the gate of the PMOS transistor 412 is coupled to the drain of the PMOS transistor 414, and the gate of the PMOS transistor 414 is coupled to the drain of the PMOS transistor 412, forming a cross-coupled pair of PMOS transistors.

In the level shifting circuit 402, an input point 420 is coupled to the gate of the NMOS transistor 408. The input point 420 is also coupled to an inverter circuit 422, which operates at voltage VddL, and which is coupled to the gate of the NMOS transistor 410.

In the assist circuit 404, two PMOS transistors 424,426 are coupled in series, drain-to-source, to the node 416. The source of the PMOS transistor 426 is coupled to a source voltage VddL. The gate of the PMOS transistor 424 is coupled to the input point 420, and the gate of the PMOS transistor 426 is coupled to a node 428 via an inverter circuit 430 which operates at voltage VddH.

Similarly, in the assist circuit 406, two PMOS transistors 432,434 are serially coupled, drain-to-source, to the output node 418. The source of the PMOS transistor 434 is coupled to a source voltage VddL. The gate of the PMOS transistor 432 is coupled indirectly to the input point 420 via the inverter circuit 422, and the gate of the PMOS transistor 434 is coupled to a node 436 via an inverter circuit 438 which operates at voltage VddH.

At steady state, at least one of the PMOS transistors 424, 426 in the assist circuit 404, and at least one of the PMOS transistors 432,434 in the assist circuit 406, is off.

The NMOS transistors 408,410 and the PMOS transistors 412,414 are arranged similarly to those in the level shifting circuit 202 of FIG. 2. At steady state, when an input signal Vin having a low voltage level is applied, the NMOS transistor 408 is turned off while the NMOS transistor 410 is turned on. The output node 418 and the gate of the PMOS transistor 412 are at a voltage level of VSS. Because the PMOS transistor 412 is turned on, the node 416 is at a voltage level of VddH.

Although the node 428 is at a value of VSS, the gate of the PMOS transistor 426 is at a value of VddH due to the inverter circuit 430. Because the gate voltage is higher than the assist circuit source voltage of VddL, the PMOS transistor 426 is turned off. Thus, the assist circuit 404 is turned off.

Similarly, the assist circuit 406 is turned off because the voltage applied to the gate of the PMOS transistor 432 is at the level of VddL, which is the same as the transistor's source voltage.

At steady state when the input signal Vin is at a high level, the NMOS transistor 408 is turned on and the NMOS transistor 410 is turned off. The node 416 is at a voltage value of VSS, as is the gate of the PMOS transistor 414. The output node 418 is at the voltage value of VddH and the PMOS transistor 412 is off. In the assist circuit 404, the PMOS transistor 424 is off since its gate voltage of VddL is the same as its source voltage. Also, in the assist circuit 406, the PMOS transistor 434 is turned off since its gate voltage of VddH is higher than its source voltage of VddL.

When the input signal changes from a low value of VSS to a high value of VddL, the NMOS transistor 408 turns on. In addition, the input signal to the NMOS transistor 410 goes from a high value of VddL to a low value of VSS due to the inverter circuit 422. Momentarily, the gate of the PMOS transistor 432 in the assist circuit 406 is at a low value of VSS while the gate of the PMOS transistor 434 in the same assist circuit is already at a low value of VSS. When this occurs, the source voltage VddL of the assist circuit 406 is greater than the gate voltages of both PMOS transistors 432,434 and both transistors 432,434 are turned on. As a Thus, the assist circuit 406 has at least two properties. First, by momentarily raising the gate voltage of the PMOS transistor 412, the assist circuit 406 weakens the PMOS transistor 412 by reducing the gate-to-source voltage, making it easier for the NMOS 408 to pull down the voltage at the node 416. Second, by momentarily charging the output node 418 to a voltage value of VddL, the assist circuit 406 does part of the work in bringing the output node 418 to its final value of VddH.

The assist circuit 404 works in a similar manner. When the input signal changes from a high value of VddL to a low value of VSS, the PMOS transistor 424 is turned on while the PMOS transistor 426 is already on. Thus, the node 416 is momentarily charged to a voltage value of VddL. Also, due to the cross coupling, the gate of the PMOS transistor 414 is brought to a value of VddL, which momentarily weakens the transistor so that the NMOS transistor 410 can more easily pull down the output voltage to a voltage value of VSS.

The assist circuits 404,406 only operate while the NMOS transistors 408,410 are pulling their respective nodes 416,418 to a final voltage value of VSS. Once the NMOS transistors have pulled their drain voltages and the nodes 416,418 to the final voltage value, the assist circuits turn off since at a final voltage, at least one PMOS transistor in each assist circuit is turned off. Thus, the assist circuits operate transiently to weaken the PMOS transistors 412,414 and to charge the nodes 416,418 to VddL.

Although for clarity, only the node 418 is labeled as "output node," it should be understood that the node 416 can also be considered an output node.

Compared to the conventional level shifting circuits 202, 302, the level shifting circuit 402 improves (reduces) the insertion delay by charging the output node 418 to VddL as soon as the input signal goes high. The insertion delay is also improved since each NMOS transistor competes against only one PMOS transistor rather than two PMOS transistors as in the level shifting circuit 302. The level shifting circuit 402 also has better low VddL behavior since the gate voltages of the PMOS devices are transiently raised to VddL, making it easier for the NMOS devices to oppose the PMOS devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present invention. Accordingly, the appended claims are intended to include within their scope such processes, machines, manufacture, compositions of matter, means, methods, or steps.

What is claimed is:

1. A level shifting circuit, comprising:
an input point;
an output point;
a cross-coupled pair of field effect transistors of a first type coupled to the output point;
a pair of assist circuits responsive to changes in input voltage levels and output voltage levels for transiently changing gate-to-source and source-to-drain voltages of the field effect transistors of the first type, the pair of assist circuits being coupled to gates of the cross-coupled pair of field effect transistors; and
a pair of field effect transistors of a second type coupled between the input and output points, the field effect transistors of the second type being responsive to input voltage levels, wherein each assist circuit comprises two field effect transistors of the first type coupled together in series drain-to-source, one of the assist circuit field effect transistors being responsive to input voltage levels and the other of the assist circuit field effect transistors being responsive to drain voltage levels of one of the field effect transistors of the second type.

2. The level shifting circuit of claim 1, wherein the assist circuits weaken the cross-coupled pair of field effect transistors of the first type.

3. A level shifting circuit, comprising:
an input point;
an output point;
a cross-coupled pair of PMOS devices coupled to said output point;

a pair of assist circuits responsive to changes in input voltage levels and output voltage levels for transiently changing gate-to-source voltages of said PMOS devices, the pair of assist circuits being coupled to gates of the cross-coupled pair of field effect transistors; and a pair of NMOS devices coupled between said input and output points, said NMOS devices being responsive to input voltage levels, wherein each assist circuit comprises two PMOS devices coupled together in series drain-to-source, one of the assist circuit PMOS devices being responsive to input voltage levels and the other of the assist circuit PMOS devices being responsive to drain voltage levels of one of the NMOS devices.

4. The level shifting circuit of claim 3, wherein the assist circuits weaken the cross-coupled pair of PMOS devices.

5. A level shifting circuit, comprising:

first and second NMOS devices each having a source, a drain and a gate, the source of each NMOS device coupled to a first voltage;

first and second cross-coupled PMOS devices, each having a source, a drain and a gate, the source of each PMOS device coupled to a second voltage that is higher than the first voltage, wherein the drain of the first PMOS device is coupled to the drain of the first NMOS device, the drain of the second PMOS device is coupled to the drain of the second NMOS device, the drain of the first PMOS device is coupled to the gate of the second PMOS device, and the drain of the second PMOS device is coupled to the gate of the first PMOS device;

a first assist circuit comprising a first inverter circuit operating at the second voltage, and third and fourth PMOS devices coupled together in series, each PMOS device having a source, a drain and a gate, wherein the drain of the third PMOS device is coupled to the source of the fourth PMOS device, the source of the third PMOS device is coupled to a third voltage that is between the first and second voltages, and the drain of the fourth PMOS device is coupled to the drain of the first NMOS device, and wherein the first inverter is coupled between the drain of the second NMOS device and the gate of the third PMOS device, the first inverter circuit for receiving input from the second NMOS device and outputting to the third PMOS device;

a second assist circuit comprising a second inverter circuit operating at the second voltage, and fifth and sixth PMOS devices coupled together in series, each PMOS device having a source, a drain and a gate, wherein the drain of the fifth PMOS device is coupled to the source of the sixth PMOS device, the source of the fifth PMOS device is coupled to the third voltage, and the drain of the sixth PMOS device is coupled to the drain of the second NMOS device, and wherein the second inverter is coupled between the drain of the first NMOS device and the gate of the fifth PMOS device, the second inverter circuit for receiving input from the first NMOS device and outputting to the fifth PMOS device;

an input point for the level shifting circuit, the input point coupled to the gate of the first NMOS device and to the gate of the fourth PMOS device; and a third inverter circuit coupled between the input point and the gate of the second NMOS device and operating at the third voltage, the third inverter circuit for receiving input from the input point and outputting to the second NMOS device, and further outputting to the gate of the sixth PMOS device.

* * * * *

(12) EX PARTE REEXAMINATION CERTIFICATE (9334th)
United States Patent
Chaba et al.

(10) Number: US 7,710,183 C1
(45) Certificate Issued: Oct. 4, 2012

(54) CMOS LEVEL SHIFTER CIRCUIT DESIGN

(75) Inventors: Ritu Chaba, San Diego, CA (US);
Dongkyu Park, San Diego, CA (US);
ChangHo Jung, San Diego, CA (US);
Sei Seung Yoan, San Diego, CA (US)

(73) Assignee: Qualcomm Incorporated, San Diego, CA (US)

Reexamination Request:
No. 90/011,799, Sep. 15, 2011

Reexamination Certificate for:
Patent No.: 7,710,183
Issued: May 4, 2010
Appl. No.: 12/204,147
Filed: Sep. 4, 2008

(51) Int. Cl.
*G06G 5/00* (2006.01)
(52) U.S. Cl. ............................ 327/333; 326/63; 326/81
(58) Field of Classification Search ........................ None
See application file for complete search history.

(56) References Cited

To view the complete listing of prior art documents cited during the proceeding for Reexamination Control Number 90/011,799, please refer to the USPTO's public Patent Application Information Retrieval (PAIR) system under the Display References tab.

*Primary Examiner* — Margaret Rubin

(57) ABSTRACT

A level shifting circuit has a pair of assist circuits. The level shifting circuit includes an input point, an output point, a pair of cross-coupled PMOS transistors coupled to the output point, and a pair of NMOS transistors coupled between the input and output points. Each assist circuit includes a pair of PMOS transistors, one responsive to an input applied to the input point, the other responsive to the drain voltage of one of the NMOS transistors. The assist circuits temporarily weaken the cross-coupled PMOS transistors when an input changes from low to high, or from high to low. The assist circuits also transiently boost the output.

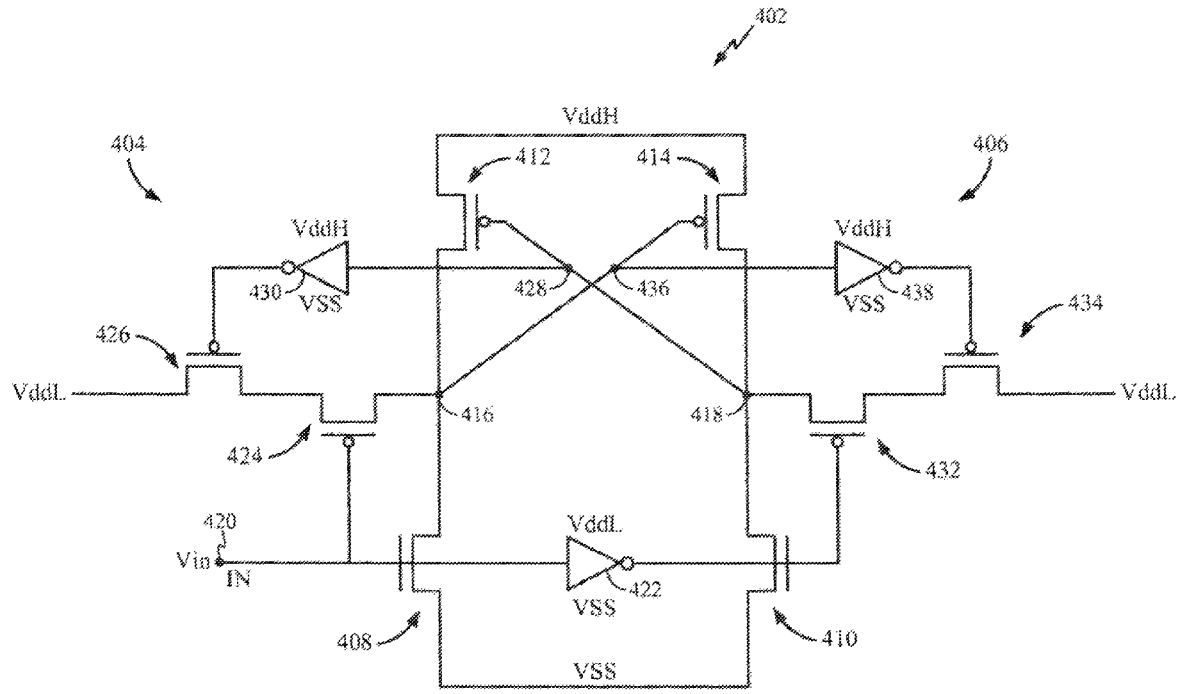

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-5 are cancelled.

\* \* \* \* \*